United States Patent [19]
Byun et al.

[11] Patent Number: 5,824,600
[45] Date of Patent: Oct. 20, 1998

[54] METHOD FOR FORMING A SILICIDE LAYER IN A SEMICONDUCTOR DEVICE

[75] Inventors: Jeong Soo Byun; Hyung Jun Kim, both of Seoul, Rep. of Korea

[73] Assignee: LG Semicon Co., Ltd., Chungcheongbuk-Do, Rep. of Korea

[21] Appl. No.: 524,457

[22] Filed: Sep. 6, 1995

Related U.S. Application Data

[63] Continuation-in-part of Ser. No. 183,329, Jan. 19, 1994, abandoned.

[30] Foreign Application Priority Data

Jan. 19, 1993 [KR] Rep. of Korea ................. 616/1993

[51] Int. Cl.$^6$ .................................................. H01L 21/44
[52] U.S. Cl. ...................... 438/682; 438/649; 438/651
[58] Field of Search .................................. 437/200, 201; 438/155, 166, 530, 535, 607, 798, 682, 974, 300, 303, 586

[56] References Cited

U.S. PATENT DOCUMENTS

| | | | |
|---|---|---|---|
| 5,047,364 | 9/1991 | Wei et al. | 437/200 |
| 5,210,043 | 5/1993 | Hosaka | 437/30 |
| 5,344,793 | 9/1994 | Zeininger et al. | 437/200 |
| 5,352,631 | 10/1994 | Sitaram et al. | 437/200 |
| 5,356,837 | 10/1994 | Geiss et al. | 437/200 |
| 5,536,684 | 7/1996 | Dass et al. | 437/201 |

FOREIGN PATENT DOCUMENTS 4-2121   1/1992   Japan .

OTHER PUBLICATIONS

"Process Limitation and Device Design Tradeoffs of Self-Aligned TiSi$_2$ Junction Formation in Submicrometer CMOS Devices" by Chih-Yuan Lu, et al., published in IEEE Transactions on Electron Devices, vol. 38, No. 2, Feb. 1991.

"A Study of the Leakage Mechanisms of Silicided n+/p Junctions" by R. Liu, et al., published in J.Appl. Phys. 63 (6) on Mar. 15, 1988.

"Self-Aligned Silicided (PtSi and CoSi$_2$) Ultra-Shallow p+/n Junctions" by E.K. Broadbent, et al., published in IEEE Electron Device Letters, vol. EDL-8, No. 7, Jul. 1987.

"Application of Self-Aligned CoSi$_2$ Interconnection in Submicrometer CMOS Transistors" by E.K. Broadbent, et al., published in IEEE Transactions on Electron Devices, vol. 36, No. 11, Nov. 1989.

"Physics of Semiconductor Devices," Second Edition, by S.M. Sze, published by John Wiley & Sons in 1981.

"Semiconductor Devices Physics and Technology" by S.M. Sze, published by John Wiley & Sons in 1983.

"A Self-Aligned CoSi$_2$ Interconnection and Contact Technology for VLSI Applications" by L. Van Den Hove, et al., published in IEEE Transactions on Electron Devices, vol. ED-34, No. 3, Mar. 1987.

"VLSI Technology" by S.M. Sze, published by McGraw-Hill Book Company. 1987.

*Primary Examiner*—Charles L. Bowers, Jr.
*Assistant Examiner*—Reneé R. Berry
*Attorney, Agent, or Firm*—Morgan, Lewis & Bockius LLP

[57] ABSTRACT

A method for forming a silicide layer in a semiconductor device, including the steps of: forming a refractory metal layer on a semiconductor substrate; forming a cobalt layer on the refractory metal layer; implanting impurities in the interface between the refractory metal layer and the cobalt layer; heat treating the semiconductor substrate such that cobalt atoms from the cobalt layer pass through the refractory metal layer and form a cobalt silicide epitaxy layer on the semiconductor substrate; and removing the remaining cobalt layer and the remaining refractory metal layer.

21 Claims, 7 Drawing Sheets

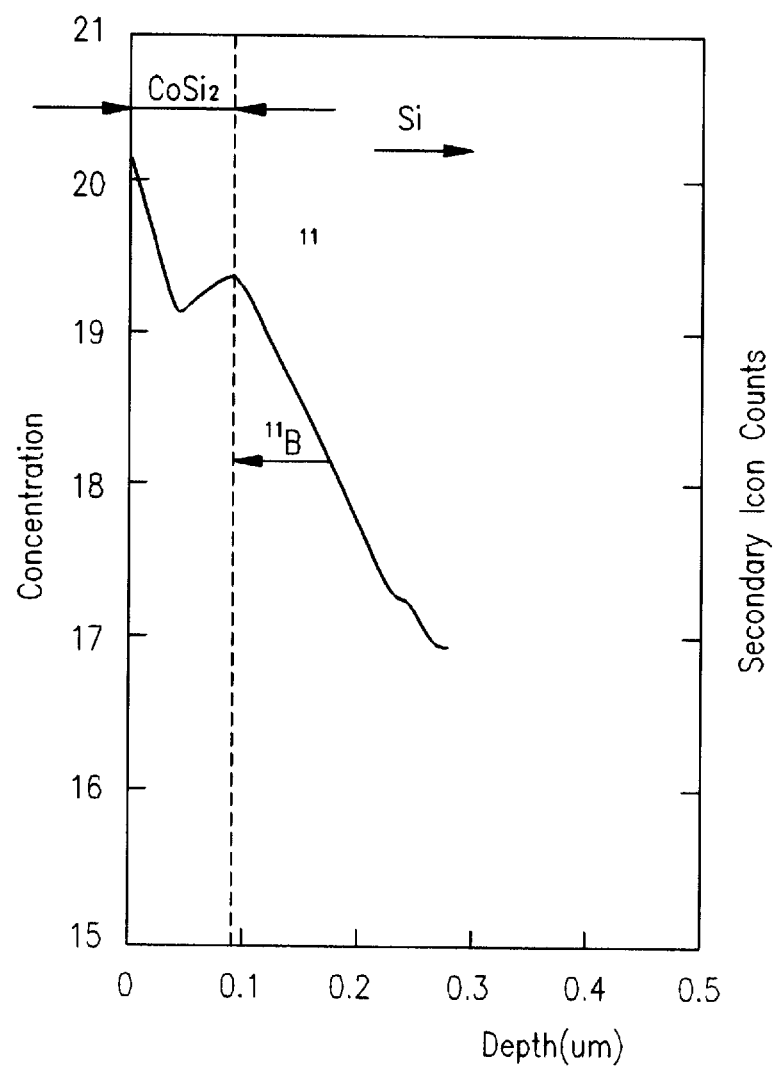

METHOD FOR FORMING A SILICIDE LAYER IN A SEMICONDUCTOR DEVICE

CROSS-REFERENCE TO RELATED APPLICATION

This is a continuation-in-part of application Ser. No. 08/1183,329, filed Jan. 19, 1994, now abandoned and whose entire contents are hereby incorporated by reference.

BACKGROUND OF THE INVENTION

The present invention relates generally to the production of semiconductor devices and, more particularly, to a method for forming a silicide layer suitable for forming a shallow cobalt silicide ($CoSi_2$) layer whose thickness does not exceed 200 Å.

Recently, very large scale integrated semiconductor devices under several micrometers are produced due to the development of semiconductor device integration technique. The high integration degree of the semiconductor devices are accompanied with reductions of the dimensions of the MOS transistors and shallow junction depths of the source/drain regions of the MOS transistors. Since the face resistance of the junction is in reverse proportion to the junction depth, this face resistance increases in accordance with shallowing of the junction depth of the source/drain region of MOS transistor. Thereby, the parasitic resistance of semiconductor device is increased.

Recently, in the production of very large scale integration circuits (VLSI), a silicide layer is preferably formed in the source/drain region in order to reduce the parasitic resistance of the semiconductor device and to improve the characteristics of the semiconductor device. The face resistance of the junction is proportional to the specific resistance but in reverse proportion to the junction depth. The specific resistance of silicon is about 200 $\mu\Omega \cdot cm$. On the other hand, the specific resistance of silicides is about 50 $\mu\Omega \cdot cm$, while it is somewhat changed in accordance with the metal components of the silicides. In this regard, the face resistance of the junction or the parasitic resistance can be reduced by forming the silicide layer in the source/drain region of the shallow junction.

Conventionally, formation of a silicide layer in the source/drain region of an MOS transistor is achieved by reacting a high melting point metal with a silicon substrate of the junction. Hence, formation of the silicide layer in the source/drain region is accompanied with consumption of silicon of the source/drain region to a depth corresponding to the thickness of the formed silicide layer. Therefore, it is required, in the production of VLSI, to provide a technique suitable for forming a shallow and stable silicide layer since the junction depth should include the thickness of the formed silicide layer corresponding to the consumed silicon of the source/drain region. In addition, the silicide layer formed in the source/drain region of the shallow junction should be provided with a uniform interface between the silicide and the silicon in order to provide the desired electric characteristics.

The conventional silicides have been generally classified into two types, that is, a polycide prepared by reacting a high melting point metal with a polysilicon and a SALICIDE (otherwise stated, self-aligned silicide) prepared by reaction of a high melting point metal with silicon. Hereinbelow, a conventional method for formation of a cobalt silicide layer in a source/drain region will be described in conjunction with accompanying drawings, FIGS. 1a to 3.

FIGS. 1a to 1c are sectional views of a semiconductor device showing a conventional method for forming the cobalt silicide layer in the source/drain region of the shallow junction. FIG. 2 is a graph of the distribution of dopant concentration of a conventional p/n junction. In order to form the cobalt silicide layer, a P-type impurity ion (dopant) is added to an n-type silicon substrate 1, thereby to form the source/drain junction on the substrate 1 as shown in FIG. 1a.

That is, when forming a p-type channel transistor, boron ions (B ions) are added to the n-type silicon substrate 1 as represented in the graph of FIG. 2, thus to form the source/drain junction on the substrate 1. Thereafter, a thin cobalt film 2 is formed, by vapor deposition, on the silicon substrate 1 having the p/n junction and heated using RTP or a furnace at a high temperature not less than 700° C. As a result of the above heat treatment, the silicon (Si) of the silicon substrate 1 reacts with the cobalt (Co) at the interface between the silicon substrate and the thin cobalt film 2. This reaction is represented by the reaction formula:

$$CoSi + Si = CoSi_2 \tag{1}$$

Hence, a cobalt silicide ($CoSi_2$) layer 3 is formed as shown in FIG. 1b.

The time of this heat treatment is controlled in order to form the desired shallow junction. In this regard, part of the thin cobalt film does not react with the silicon and remains as it was.

The resulting structure of FIG. 1b is, thereafter, etched with a solution of $3HCl:1H_2O_2$. As a result of this etching, only the remaining thin cobalt film 2 is etched and removed from the structure as shown in FIG. 1c since there is a difference of etching selection ratio between the remaining thin cobalt film 2 and the formed cobalt silicide layer 3. See, (1) E. K. Broadvent, M. Delfino, A. E. Morgan, D. K. Sadna and P. Mallot, "Self-aligned silicided (PtSi and $CoSi_2$) Ultra-Shallow, p+/n Junctions," IEE Electron Device Lett., EDL-8, 318 (1987); (2) E. K. Broadvent, R. F. Irani, A. E. Morgan and P. Maillot, "Application of Self-Aligned $CoSi_2$ Interconnection in Submicrometer CMOS Transistors," IEEE Trans. Electron Devices, ED-36, 2440 (1989); and (3) L. Van den Hove, R. Wolters, K. Maex, R. F. de Keers Maecker and G. J. Declerk, "A Self-aligned $CoSi_2$ Interconnection and Contact Technology for VLSI Application," IEEE Trans. Electron Device, ED-34, 554 (1987).

However, the above cobalt silicide formation method has several problems. For example, the thickness of the formed silicide layer of that method exceeds about 900 Å and, as a result, this cobalt silicide formation method is rarely reproduced or duplicated when it is used to produce a shallow junction semiconductor device having a junction depth not more than 0.2 $\mu m$. Furthermore, use of such a silicide deteriorates the characteristics of the semiconductor device.

Otherwise stated, it has been noted that the contact resistance is reduced as the dopant concentration of the silicon section just below the cobalt silicide ($CoSi_2$) layer is increased and the stability of the semiconductor device is improved in proportion to the distance between the silicide/silicon interface and the junction. See, S. M. Sze, "Physics of Semiconductor Device," 2nd, Ed. John Wiley & Sons, N.Y., 1981, p. 304.

However, the above cobalt silicide formation method results in a thick cobalt silicide layer of about 900 Å being formed and consumes silicon as much as the thickness of the formed cobalt layer as represented in the graph of FIG. 3 showing redistribution of dopant concentration according to the above silicide layer formation method. See, M. A. Nicolet and S. S. Lau, in "VLSI Electronics: Microstructure Science," Vol. 6, N. G. Einspruch and G. B. Larrbe, Eds. (Academic Press, N.Y., 1983) p. 329.

At this time, considerable amount of dopant is lost by the redistribution of the dopant concentration and, as a result, the dopant concentration at the silicide/silicon interface is reduced. Thus, the contact resistance is increased as represented in the graphs of FIGS. 2 and 3. From these graphs, it will be noted that the boron distribution is changed and the dopant (boron) concentration at the silicide/silicon interface is considerably reduced as a result of formation of the thick silicide layer. See, C. Y. Liu, J. M. Sung, R. Liu, N. S. Tsai, R. Shnh, S. J. Hillenius and H. C. Kirch, "Process Limitation and Device Design Tradeoffs of Self-Aligned $TiSi_2$ Junction Formation in Submicrometer CMOS Devices," IEEE Trans. Electron Devices, ED-38, 246 (1991).

Such consumption of silicon of the junction makes it difficult to produce a stable shallow junction device. When the consumption of silicon of the junction exceeds one-half of the junction depth, the leakage current of the junction is rapidly increased. See, D. C. Chen, T. R. Cass, J. E. Turner, P. P. Merchant and K. Y. Chiu, "$TiSi_2$ Thickness Limitation for Use with Shallow Junction and SWAMI or LOCOS Isolation," IEEE Trans. Electron Devices, ED-33, 1463 (1986).

In addition, roughness of the silicide/silicon interface occurs and, consequently, the distance between the junction and the silicide is not uniform. Hence, the electric characteristics of the semiconductor devices are deteriorated. See, R. Liu, D. S. Williams and W. T. Lynch, "A study of the Leakage mechanism of Silicided n+/p junctions," J. Appl. Phys., 63, 1990 (1988).

SUMMARY OF THE INVENTION

It is, therefore, an object of the present invention to provide a method for forming a silicide layer of a semiconductor device in which the aforementioned problems are overcome, which minimizes the silicon consumption, prevents redistribution of the dopant concentration and provides the desired shallow junction.

In order to accomplish the above object, a method for forming a silicide layer in accordance with an embodiment of the present invention comprises the steps of: forming a refractory metal layer and a thin cobalt film on a silicon substrate by vapor deposition under vacuum conditions; forming a silicide layer at an interface between the silicon substrate and the refractory metal layer by heat treatment; and etching and removing both the non-reacted thin cobalt film and the non-reacted refractory metal layer using the etching solution.

Another definition of this invention includes a method for forming a silicide layer in a semiconductor device, including the steps of: forming a refractory metal layer on a semiconductor substrate; forming a cobalt layer on the refractory metal layer; implanting impurities in the interface between the refractory metal and the cobalt layer; heat treating the semiconductor substrate such that cobalt atoms from the cobalt layer pass through the refractory metal layer and form a cobalt silicide epitaxy layer on the semiconductor substrate; and removing the remaining cobalt layer and the remaining refractory metal layer.

BRIEF DESCRIPTION OF THE DRAWINGS

The above and other objects, features and advantages of the present invention will be more clearly understood from the following detailed description taken in conjunction with the accompanying drawings, in which:

FIG. 3 is a graph showing redistribution of dopant concentration according to the conventional silicide layer formation method;

DETAILED DESCRIPTION OF THE PREFERRED EMBODIMENTS

Figure 1A:
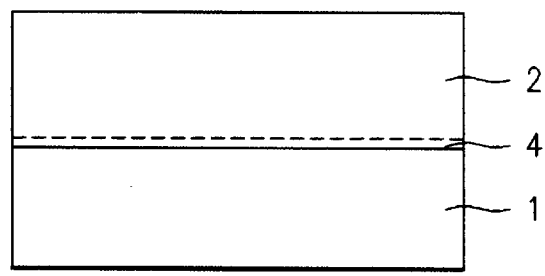
FIGS. 1a to 1c are sectional views of a semiconductor device showing a conventional method for forming a cobalt silicide layer in a source/drain region of a shallow junction.
Figure 1B:
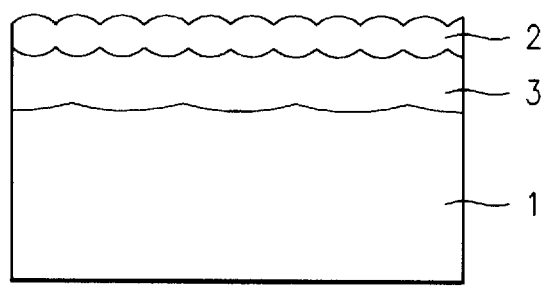
Figure 1C:
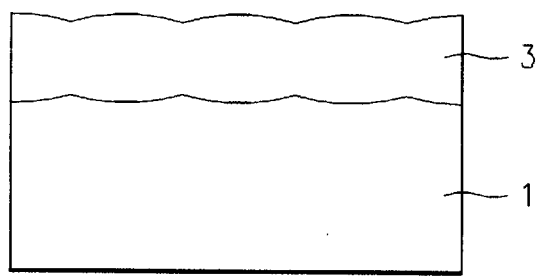
Figure 2:
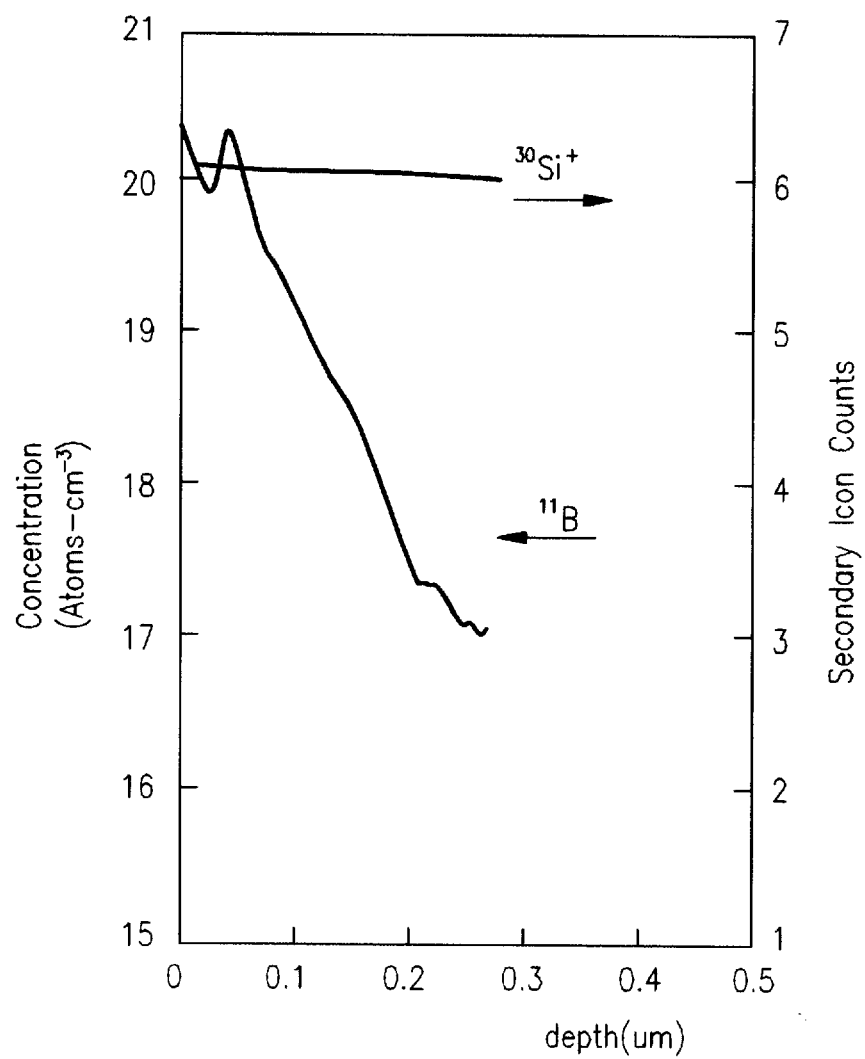
FIG. 2 is a graph showing a distribution of dopant concentration of a conventional p/n junction.
Figure 4A:
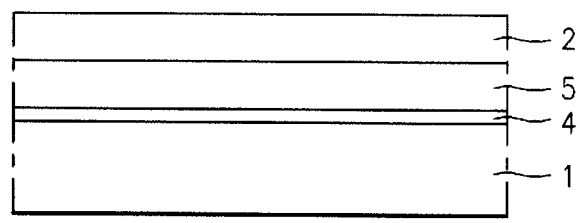
FIGS. 4a to 4d are sectional views of a semiconductor device showing a method for forming a silicide layer in a source/drain region of shallow junction in accordance with an embodiment of the present invention.
Figure 4B:
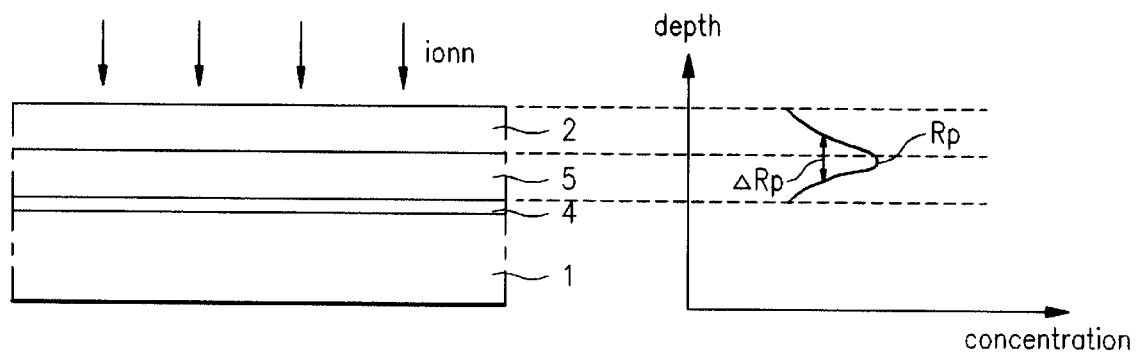
Figure 5:
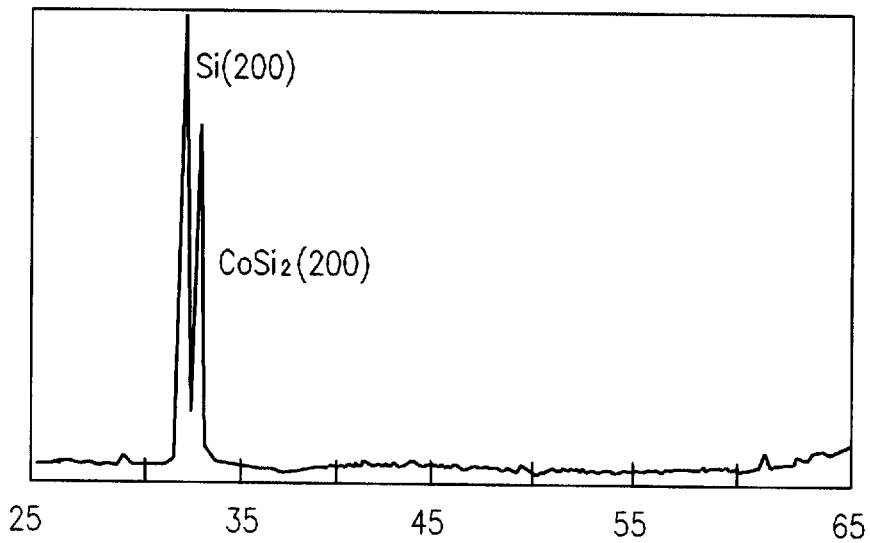
FIG. 5 is a spectrum of a silicide layer using Ta as a refractory metal in accordance with the present invention.
Figure 6:
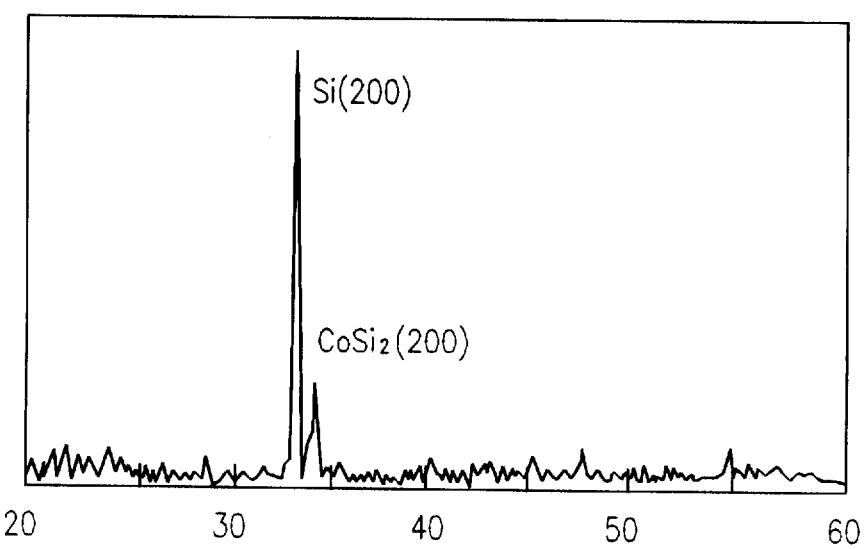
FIG. 6 is a spectrum of a silicide layer using Zr as a refractory metal in accordance with the present invention.
Figure 7:
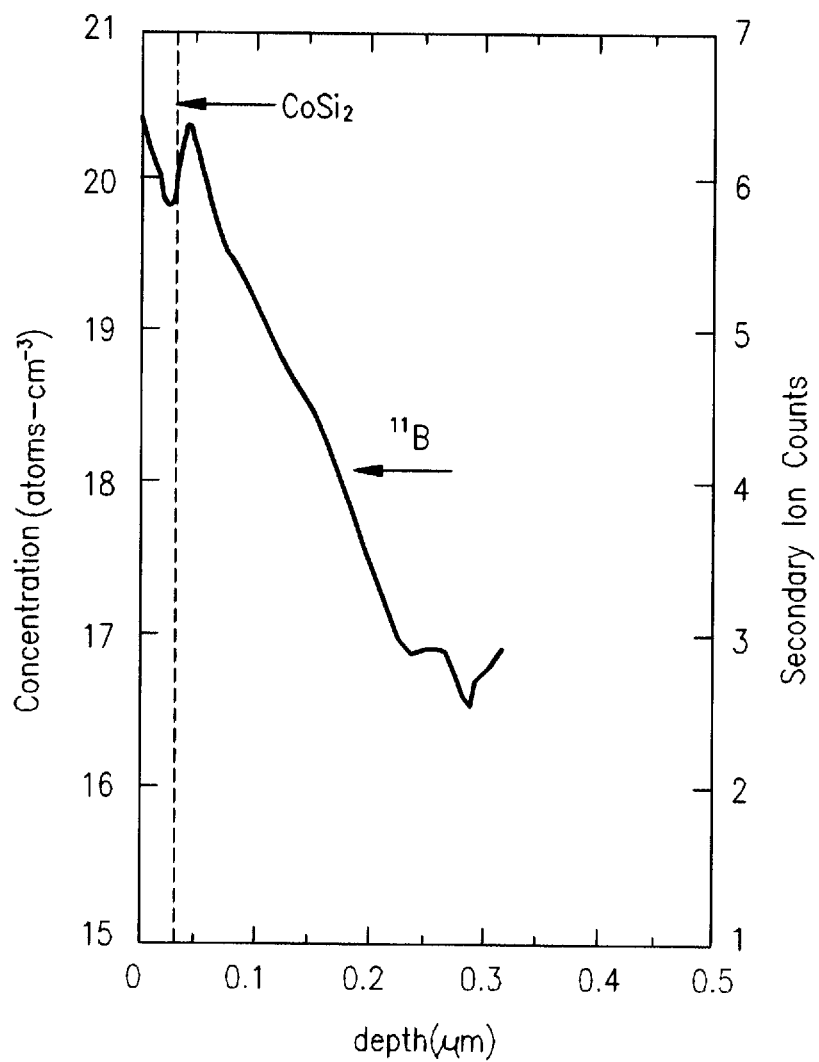
FIG. 7 is a graph showing the distribution of dopant concentration in accordance with the present invention.

FIGS. 4a to 4d are sectional views of a semiconductor device showing a method for forming a silicide layer in a source/drain region of a shallow junction in accordance with an embodiment of the present invention. FIGS. 5 and 6 are spectrums of silicide layers using Ta and Zr, respectively, as refractory metals according to the present invention. FIG. 7 is a graph showing the distribution of dopant concentration in accordance with the present invention. In order to form the cobalt silicide layer by the method of this invention, p-type impurity ions (boron B) are first implanted to an n-type silicon substrate 1 to form the source/drain junction on the substrate 1 as showing in FIG. 4a. Thereafter, the substrate 1 in which the p-type impurity ions are implanted is exposed to form a native oxide layer or film 4 on its surface. That is, in the case of formation of a p-type channel transistor, the boron (B) ions are implanted to the n-type silicon substrate 1 as represented in the graph of FIG. 7, thereby to form the source/drain junction on the substrate 1.

Thereafter, a refractory metal layer 5, such as a tantalum (Ta) layer, zirconium (Zr) layer or hafnium (Hf) layer is formed by vapor deposition on the silicon substrate 1 having the source/drain junction and a thin cobalt film 2 is formed by vapor deposition on the refractory metal layer 5 under the continued vacuum condition.

In this vapor deposition of the refractory metal layer 5 and the cobalt thin film 2 on the silicon substrate 1, the thickness of the refractory metal layer 5 does not exceed 80 Å and the thickness of the thin cobalt layer 2 does not exceed 250 Å. As shown in FIG. 4b, subsequently, Argon (Ar) ions are implanted under conditions of energy (55 KeV) and dose ($1\times10^{14}$ atoms/cm$^2$) so as to make the lower part of the cobalt layer 2 and the upper part of the substrate 1. amorphous, centering around the refractory metal layer S being an interlayer between the cobalt layer 2 and the substrate 1. At this time, the ion-implantation depth of the Ar ions is $R_p=256$ Å and $\Delta R_p=165$ Å. On the contrary, for the case of n-type source and drain junctions with n-type impurity ions, a refractory metal 5 such as Ta, Zr or Hf is formed on a p-type substrate 1 and a cobalt layer 2 is then formed on the refractory metal layer 5.

Thereafter V group of impurity ions such as phosphorous (P) and arsenic (As) are implanted under condition of energy (90 KeV) and dose ($1\times10^{14}$ atoms/cm$^2$) so as to make the lower part of the cobalt layer 2 and the upper part of the substrate 1 amorphous, centering the refractory metal layer 5 being an interlayer between the substrate 1 and the cobalt layer 2, and also to form source/drain junctions.

Figure 4C:
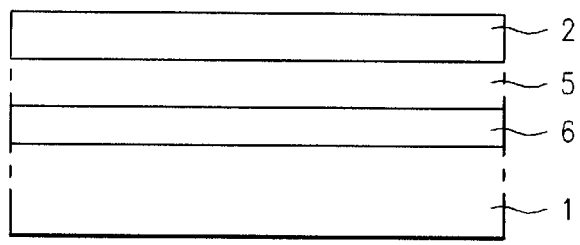

As shown in FIG. 4c, the above ion-implantation is followed by heat treatment (RTP). The heat treatment is conducted for about twenty seconds at about 700° C. under nitrogen ambient or ammonium ambient. As a result of this heat treatment, cobalt atoms of the thin cobalt film 2 pass through the refractory metal layer 5 and form an epitaxy layer 6 of cobalt silicide $CoSi_2$ on the silicon substrate 1 as shown in FIG. 4c. At this time, the thickness of cobalt silicide layer 6 does not exceed 200 Å. In addition, non-reacted parts remain in both the thin cobalt film 2 and the refractory metal layer 5.

Figure 4D:
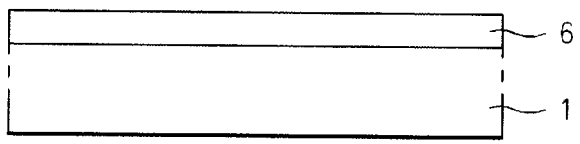

The resulting structure of FIG. 4c is, thereafter, etched using a solution of $3HCl:1H_2O_2$ for about fifteen seconds. As a result of this etching, the remaining cobalt thin film 2 and the remaining refractory metal layer 5 except for the formed cobalt silicide layer 6 are etched and removed from the structure as shown in FIG. 4d.

In the above silicide layer formation method of the present invention, the refractory metal layer 5 formed by the vapor deposition reduces the native oxide layer 4 of the silicon substrate 1 during the heat treatment since its oxidation potential is larger than that of silicon. The refractory metal layer 5 instead of the silicon substrate 1 is consumed during the silicide formation. In the heat treatment, the early silicide product is 300° C. The lattice constant of cobalt silicide is similar to that of silicon, so that the cobalt silicide is apt to grow into the epitaxy layer. Accordingly, the cobalt atoms pass through the refractory metal layer 5 during the heat treatment in order to reach the silicon substrate surface, from which surface the natural oxidant layer 4 was reduced and removed, and to form the cobalt silicide on the substrate surface.

Figure 8:
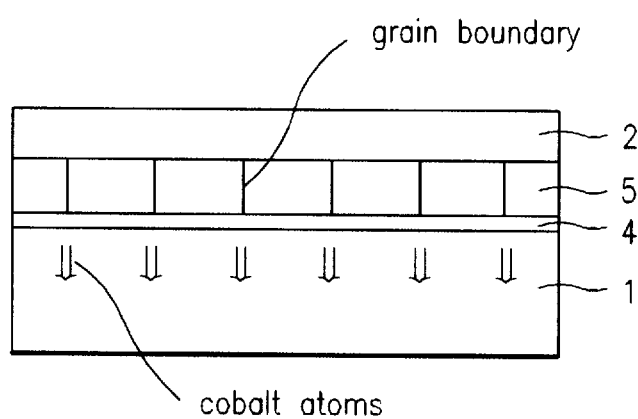
FIG. 8 shows the preferential diffusion of the cobalt atoms into the substrate in accordance with the present invention.

In case of forming a $CoSi_2$ solicaide (that is, self-aligned $CoSi_2$ silicide) using a bilayer constituted by a C cobalt (Co) layer and a refractory metal layer, there is a problem in that even though the interface between the cobalt layer and the refractory metal layer is uniform, spiking of $CoSi_2$ may occur in part. The main reason why such spiking may occur is because Co atoms are preferentially diffused into the substrate 1 passing through the grain boundary as shown in FIG. 8.

As shown in FIGS. 4a–4d, therefore, impurity ions of impurities such as Ar, As and P are implanted to make the lower part of the cobalt layer and the upper part of the substrate 1 amorphous, centering around the refractory metal layer 5 being an interlayer between the cobalt layer 2 and the substrate 1, and moreover to prevent the preferential diffusion of cobalt atoms through the grain boundary. And, also, in the above-case which forms n-type source and drain junctions in the p-type substrate, the process can be simplified since an ion-implantation is carried out for both amorphous state and junction without carrying out the ion-implantation before forming the cobalt layer and the refractory metal layer.

FIGS. 5 and 6 are spectrums of silicide layers using Ta and Zr, respectively, as the refractory metal according to the present invention. Both the cobalt silicides of FIGS. 5 and 6 are formed by heat treatment at 750° C. As represented in the spectrums of FIGS. 5 and 6, the thickness of the cobalt silicide growing on the silicon substrate surface can be controlled by the refractory metal selected.

The silicide formation method of the present invention shows the following effects.

First, the method of this invention forms, by vapor deposition, a refractory metal layer on a silicon substrate having a junction and forms, by vapor disposition, a thin cobalt film on the formed refractory metal layer prior to heat treatment, thereby forming a shallow cobalt silicide layer of a thickness not exceeding 200 Å in accordance with the refractory metal used. In this regard, this method easily provides a shallow junction.

Second, this method forms a shallow cobalt silicide layer at the interface of the silicon substrate by vapor deposition of the refractory metal layer on the silicon substrate having the junction and by vapor deposition of the thin cobalt film on the formed refractory metal layer and by heat treatment of the resulting structure. In this regard, this method prevents redistribution of the dopant, constituting the junction, as represented in the graph of FIG. 7.

Third, the cobalt silicide layer formed by this method is preferably shallow, so that this method has the advantage that the dopant concentration at the interface between the silicon substrate and the cobalt silicide layer is not reduced.

Furthermore, the cobalt silicide layer growing on the silicon substrate shows epitaxy characteristics, so that the interface between the cobalt silicide layer and the silicon substrate is flattened such that the desired processing stability is achieved. In this regard, this method improves the electric characteristics of the semiconductor device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a silicide layer in a semiconductor device, comprising the steps of:
    forming a refractory metal layer on a semiconductor substrate;
    forming a cobalt layer on the refractory metal layer;
    implanting impurity ions in the interface between the refractory metal layer and the cobalt layer to have an amorphous structure at a lower part of the cobalt layer and an upper part of the substrate;
    heat treating the semiconductor substrate such that cobalt atoms from the cobalt layer pass through the refractory metal layer and form a cobalt silicide epitaxy layer on the semiconductor substrate; and
    removing the remaining cobalt layer and the remaining refractory metal layer.

2. The method according to claim 1 wherein a refractory metal of the refractory metal layer is selected from the group of tantalum, zirconium and hafnium.

3. The method according to claim 1 wherein the thickness of the cobalt layer does not exceed 250 Å.

4. The method according to claim 1, wherein the impurity ions are Argon ions for an n-type substrate.

5. The method according to claim 1, wherein the impurity ions are n-type ions for a p-type substrate.

6. The method according to claim 1 wherein said ion implanting step is with an energy of 90 KeV and a $1 \times 10^{14}$ atoms/cm$^2$ dosage.

7. The method according to claim 1 wherein said heat treating step is carried out for about twenty seconds at about 700° C. in a nitrogen or ammonium ambient.

8. The method according to claim 1 wherein said refractory metal and cobalt layer forming steps are by vapor deposition.

9. The method according to claim 1 wherein the thickness of the refractory metal layer does not exceed 80 Å.

10. The method according to claim 1 wherein said removing step includes etching with a solution of $3HCl:1H_2O_2$.

11. The method according to claim 10 wherein said etching step does not remove the cobalt silicide epitaxy layer.

12. The method according to claim 1 wherein said heat treating step is carried out at temperatures between 500° C.–900° C.

13. The method according to claim 1 further comprising before said refractory metal layer forming step, forming a source/drain junction on the substrate.

14. The method according to claim 1, wherein the amorphous structure at a lower part of the cobalt layer and an upper part of the substrate has an etch selectivity different from an etch selectivity of the silicide layer.

15. A method for forming a silicide layer in a semiconductor device having an n-type substrate, the method comprising the steps of:

implanting first impurity ions into the substrate;

forming a refractory metal on the substrate;

forming a cobalt layer on the refractory metal layer;

implanting second impurity ions in the interface between the refractory metal layer and the cobalt layer to have an amorphous structure at a lower part of the cobalt layer and an upper part of the substrate;

heat treating the substrate such that cobalt atoms from the cobalt layer pass through the refractory metal layer and form a cobalt silicide epitaxy layer on the substrate; and removing the remaining cobalt layer and the remaining refractory metal layer.

16. The method according to claim 15, wherein the first impurity ions are p-type.

17. The method according to claim 15, wherein the second impurity ions are Argon ions.

18. The method according to claim 15, wherein the step of removing the remaining cobalt layer and the remaining refractory metal layer includes etching with a solution of $3HCl:1H_2O_2$.

19. A method for forming a silicide layer in a semiconductor device having a p-type substrate, the method comprising the steps of:

forming a refractory metal on the substrate;

forming a cobalt layer on the refractory metal layer;

implanting impurity ions in the interface between the refractory metal layer and the cobalt layer to have an amorphous structure at a lower part of the cobalt layer and an upper part of the substrate and to form a source/drain junction at the substrate simultaneously;

heat treating the substrate such that cobalt atoms from the cobalt layer pass through the refractory metal layer and form a cobalt silicide epitaxy layer on the substrate; and removing the remaining cobalt layer and the remaining refractory metal layer.

20. The method according to claim 19, wherein the impurity ions are n-type ions.

21. The method according to claim 19, wherein the step of removing the remaining cobalt layer and the remaining refractory metal layer includes etching with a solution of $3HCl:1H_2O_2$.

* * * * *